(12) United States Patent
Tamura et al.

(10) Patent No.: US 8,362,683 B2
(45) Date of Patent: Jan. 29, 2013

(54) ORGANIC LIGHT EMITTING DISPLAY APPARATUS

(75) Inventors: Shinichiro Tamura, Yongin (KR); Hyo-Seok Kim, Yongin (KR); Byoung-Ki Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 36 days.

(21) Appl. No.: 13/064,015

(22) Filed: Mar. 2, 2011

(65) Prior Publication Data

US 2011/0220921 A1  Sep. 15, 2011

(30) Foreign Application Priority Data

Mar. 9, 2010 (KR) .................. 10-2010-0021016

(51) Int. Cl.
 *H01L 51/50* (2006.01)
 *H01L 51/56* (2006.01)

(52) U.S. Cl. .......... 313/500; 313/505; 313/503; 445/24; 445/25; 427/66

(58) Field of Classification Search .......... 313/500–512; 445/24, 25; 427/66; 315/169.3; 345/36, 345/44, 76–80
See application file for complete search history.

(56) References Cited

U.S. PATENT DOCUMENTS

| | | | |
|---|---|---|---|
| 6,624,839 B2 * | 9/2003 | Gaudiana et al. | 347/238 |
| 2002/0070909 A1 | 6/2002 | Asano et al. | |
| 2002/0109457 A1 | 8/2002 | Duineveld et al. | |
| 2005/0151462 A1 | 7/2005 | Miyagawa | |
| 2006/0033422 A1 | 2/2006 | Chao et al. | |
| 2007/0024183 A1 * | 2/2007 | Lih et al. | 313/504 |
| 2010/0270912 A1 * | 10/2010 | Ko | 313/504 |

FOREIGN PATENT DOCUMENTS

| | | | |
|---|---|---|---|
| GB | 2437110 A | * | 10/2007 |
| JP | 8-227276 A | | 9/1996 |
| JP | 2000-152260 A | | 5/2000 |
| JP | 2001-257080 A | | 9/2001 |
| KR | 10 2005-0061322 A | | 6/2005 |
| KR | 10 2006-0055098 A | | 5/2006 |
| KR | 10-2006-0057841 A | | 5/2006 |
| KR | 10 2007-0095152 A | | 9/2007 |
| KR | 10-2009-0021580 A | | 3/2009 |
| KR | 10-2010-0118330 A | | 11/2010 |

OTHER PUBLICATIONS

Korean Notice of Allowance in KR 10-2010-0021016, dated Nov. 14, 2011 (Tamura, et al.).
Japanese Office action for JP 2011-027724, dated May 8, 2012 (Tamura, et al.).

* cited by examiner

*Primary Examiner* — Mariceli Santiago
(74) *Attorney, Agent, or Firm* — Lee & Morse, P.C.

(57) ABSTRACT

An organic light emitting display apparatus includes a plurality of sub-pixels, each of the sub-pixels having a first electrode, a second electrode facing the first electrode, and an intermediate layer disposed between the first and second electrodes, the intermediate layer having a plurality of layers including an organic emission layer, at least one layer of the plurality of layers in the intermediate layer being commonly shared by two sub-pixels arranged in a first direction and by at least two sub-pixels arranged in a second direction perpendicular to the first direction.

13 Claims, 6 Drawing Sheets

ORGANIC LIGHT EMITTING DISPLAY APPARATUS

BACKGROUND

1. Field

Embodiments relate to an organic light emitting display apparatus, and more particularly, to an organic light emitting display apparatus for improving image quality characteristics.

2. Description of the Related Art

Display apparatuses, e.g., flat panel display apparatuses, may be thin and portable. Among the flat panel display apparatuses, organic light emitting display apparatuses are self-emissive display apparatuses having wide viewing angles, high contrast, and fast response speeds, and thus, are being considered as next generation display apparatuses.

In an organic light emitting display apparatus, a first electrode and a second electrode are disposed on both sides of an intermediate layer that includes an organic emission layer. Voltage is applied to the first and second electrodes, so that the organic emission layer emits visible rays. A conventional intermediate layer including the organic emission layer may be formed by using a mask.

SUMMARY

Embodiments are directed to an organic light emitting display apparatus, which substantially overcomes one or more of the problems due to the limitations and disadvantages of the related art.

It is therefore a feature of an embodiment to provide an organic light emitting display apparatus having a structure capable of improving image quality characteristics of the display apparatus, and to a method of forming the same.

At least one of the above and other features and advantages may be realized by providing an organic light emitting display apparatus including a plurality of sub-pixels, each of the sub-pixels having a first electrode, a second electrode facing the first electrode, and an intermediate layer disposed between the first and second electrodes, the intermediate layer having a plurality of layers including an organic emission layer, at least one layer of the plurality of layers in the intermediate layer being commonly shared by two sub-pixels arranged in a first direction and by at least two sub-pixels arranged in a second direction perpendicular to the first direction.

The at least one commonly shared layer of the intermediate layer may be continuous in four sub-pixels arranged in the second direction, the four sub-pixels in the second direction emitting light of a same color.

The at least one commonly shared layer of the intermediate layer may be the organic emission layer.

The at least one commonly shared layer of the intermediate layer may have a square shape.

The at least one commonly shared layer of the intermediate layer may correspond to sub-pixels emitting light of the same color.

The at least one commonly shared layer of the intermediate layer may overlap at least four sub-pixels, the at least four sub-pixels being adjacent to each other and arranged in a matrix pattern.

The at least one commonly shared layer of the intermediate layer may be a continuous layer overlapping at least four sub-pixels and regions therebetween.

At least one of the above and other features and advantages may also be realized by providing an organic a method of forming an organic light emitting display apparatus with a plurality of sub-pixels, the method including forming a first electrode in each pixel, forming a second electrode facing the first electrode. and forming an intermediate layer between the first and second electrodes, the intermediate layer having a plurality of layers including an organic emission layer, at least one layer of the plurality of layers in the intermediate layer being commonly formed in two sub-pixels arranged in a first direction and in at least two sub-pixels arranged in a second direction perpendicular to the first direction.

Forming the at least one layer of the plurality of layers in the intermediate layer may include using a mask having openings, the openings in the mask being larger than a size of a single sub-pixel in the organic light emitting display apparatus. Each opening in the mask overlaps at least four sub-pixels emitting a same color of light.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
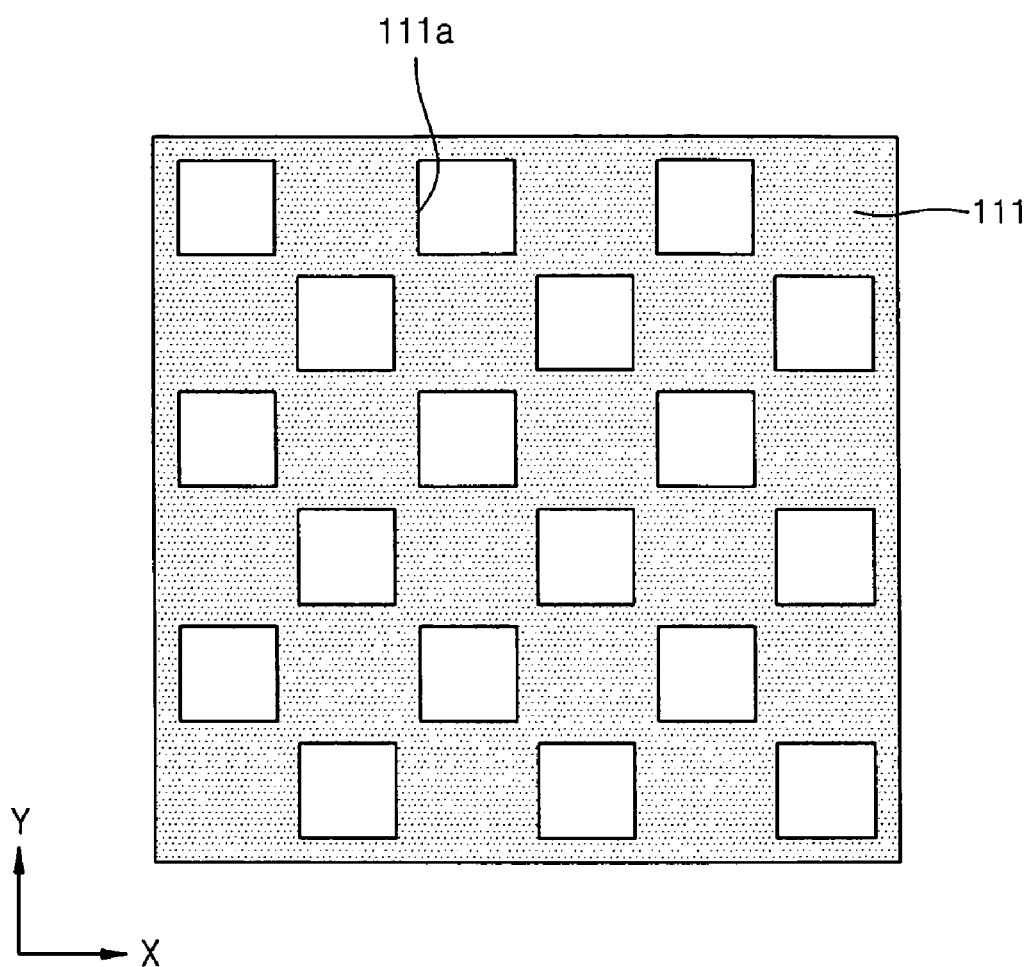
FIGS. 1A through 1C illustrate schematic plan views of a mask used to form an intermediate layer in an organic light emitting display apparatus according to an embodiment.

Korean Patent Application No. 10-2010-0021016, filed on Mar. 9, 2010, in the Korean Intellectual Property Office, and entitled: "Organic Light Emitting Display Apparatus," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 1B:
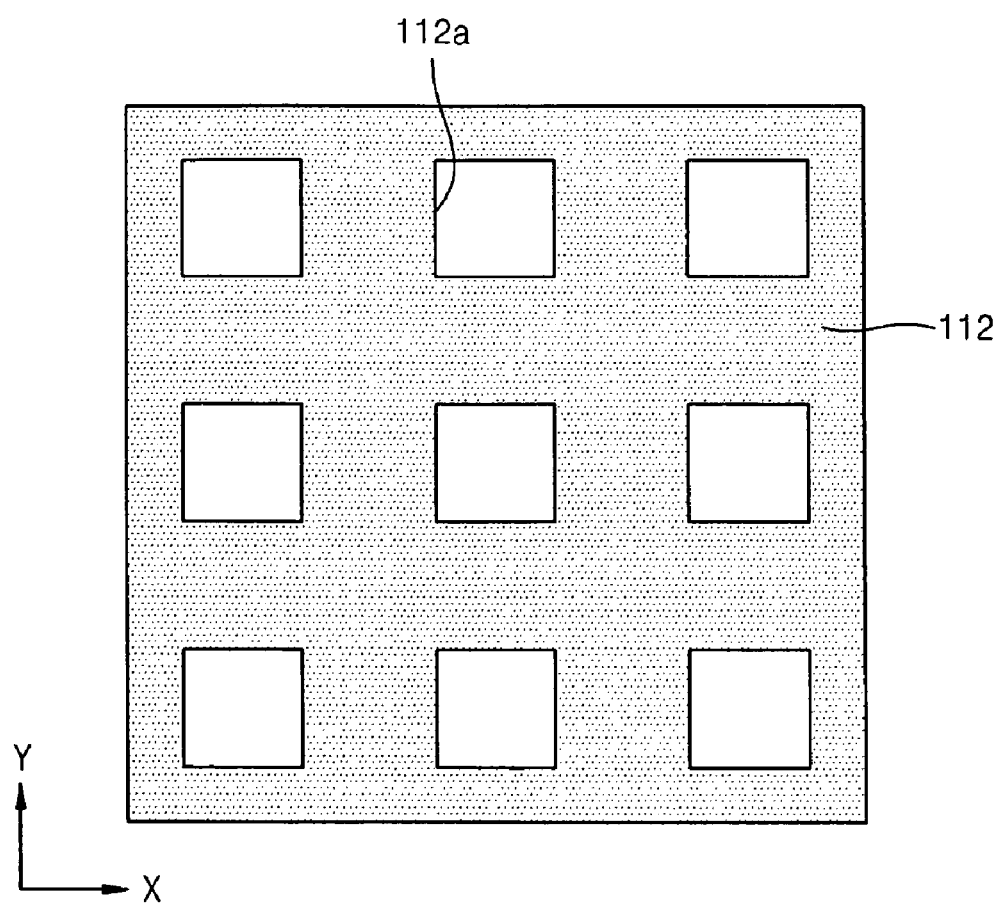
Figure 1C:
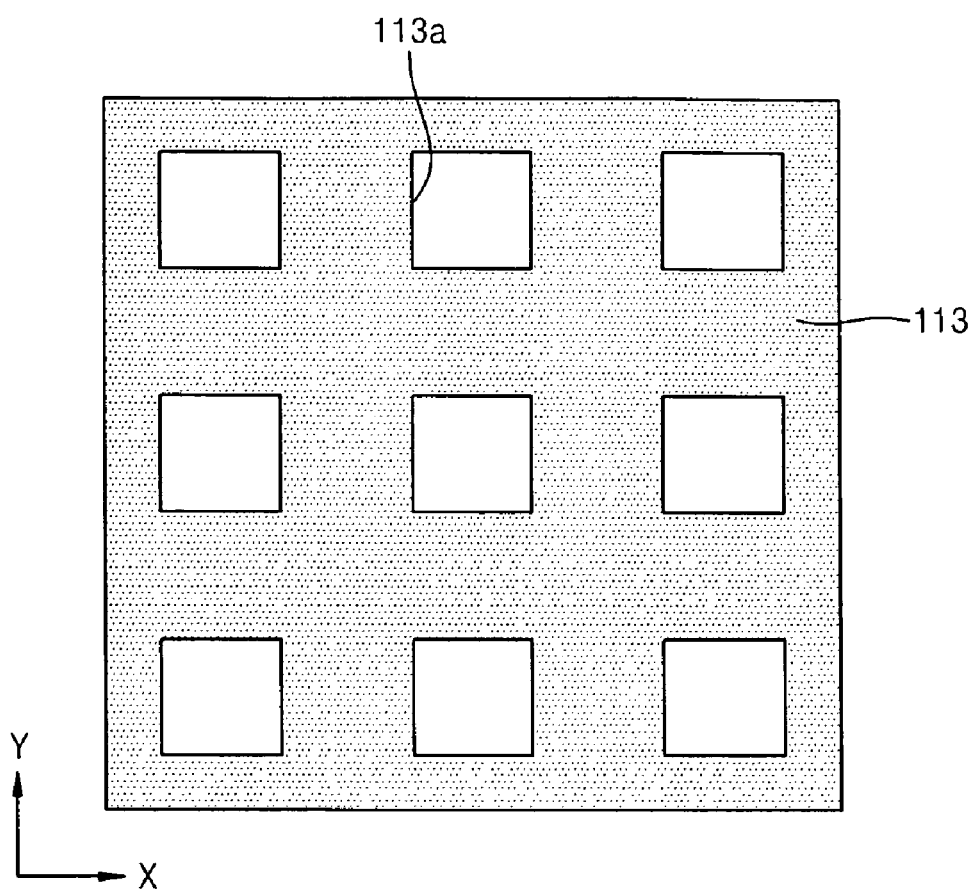
Figure 2:
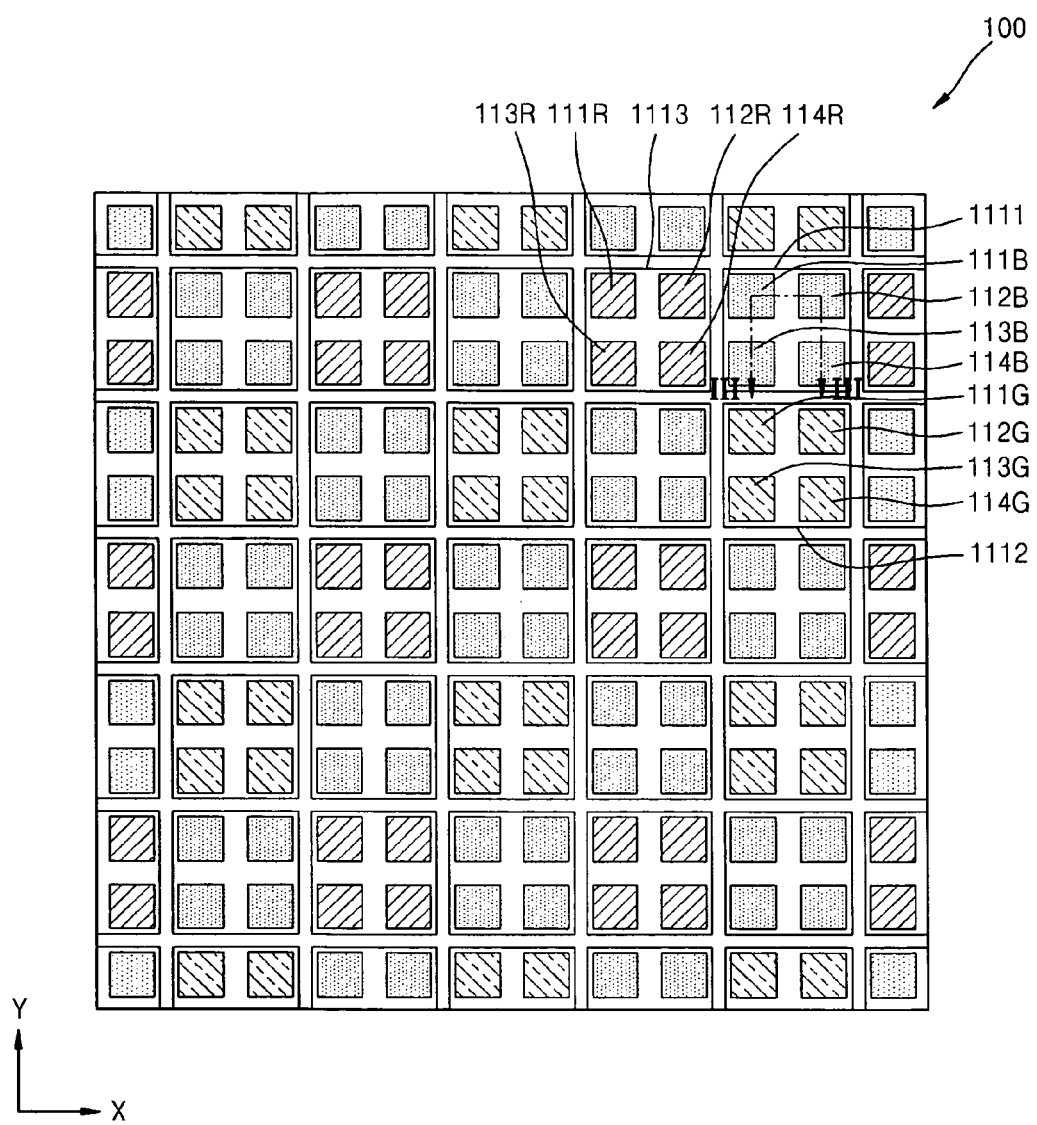
FIG. 2 illustrates a schematic plan view of an organic light emitting display apparatus according to an embodiment.
Figure 3:
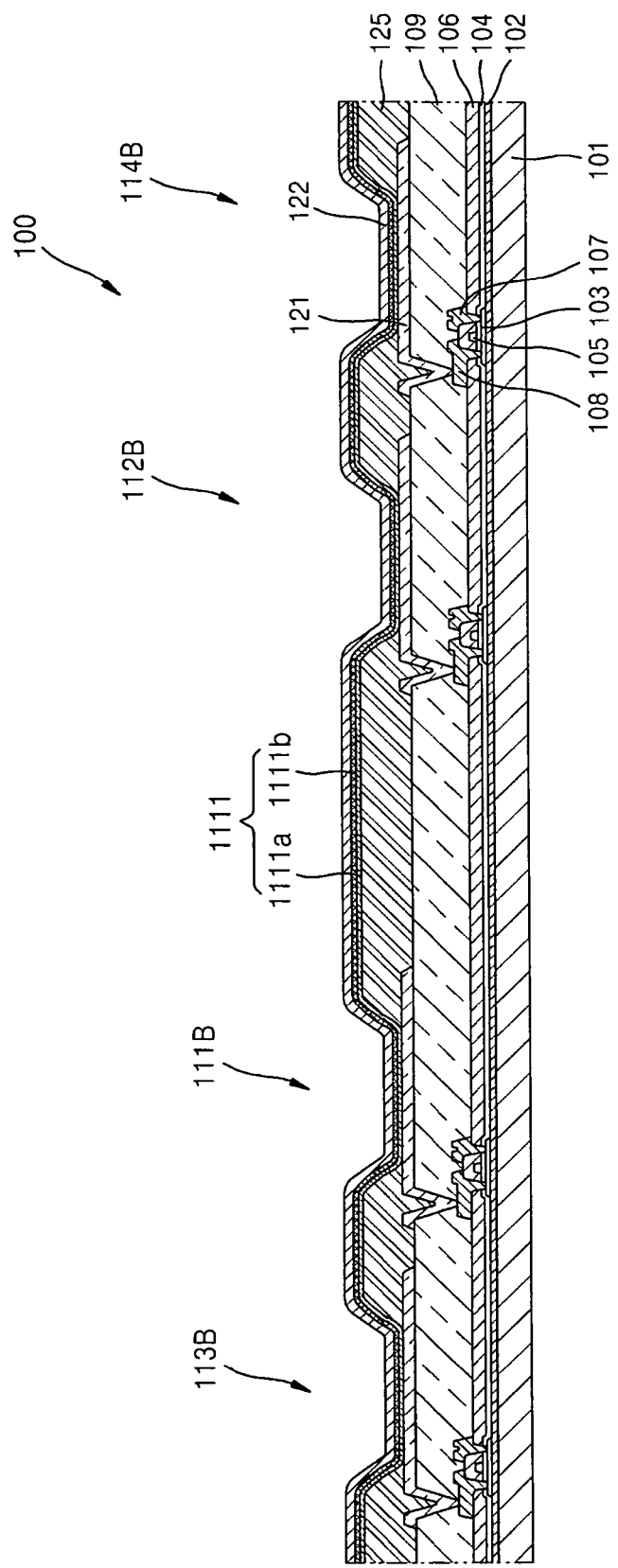
FIG. 3 illustrates a cross-sectional view of the organic light emitting display apparatus taken along line III-III of FIG. 2.

FIGS. 1A through 1C illustrate schematic plan views of first through third masks used to form an intermediate layer in an organic light emitting display apparatus according to an embodiment, FIG. 2 illustrates a schematic plan view of an organic light emitting display apparatus 100 according to an embodiment, and FIG. 3 illustrates a cross-sectional view of the organic light emitting display apparatus 100 along line III-III of FIG. 2.

FIG. 1A illustrates a first mask 111 including a plurality of first openings 111a. The first mask 111 is a mask for commonly forming at least one layer among a plurality of layers included in a first intermediate layer 1111 (FIGS. 2 and 3) of the organic light emitting display apparatus 100. The first intermediate layer 1111 is an intermediate layer corresponding to sub-pixels emitting a first color, e.g., blue visible rays.

For example, the first mask 111 may be a mask for forming an organic emission layer in the first intermediate layer 1111. The first openings 111*a* of the first mask 111 may correspond to regions of the layer, e.g., the organic emission layer, that is commonly formed among the first intermediate layer 1111.

FIG. 1B illustrates a second mask 112 including a plurality of second openings 112*a*. The second mask 112 is a mask for commonly forming at least one layer among the plurality of layers in a second intermediate layer 1112 (FIG. 2). The second intermediate layer 1112 is an intermediate layer corresponding to sub-pixels for emitting a second color, e.g., green visible rays.

For example, the second mask 112 may be a mask for forming an organic emission layer in the second intermediate layer 1112. The second openings 112*a* may correspond to regions of the layer, e.g., the organic emission layer, that is commonly formed among the second intermediate layer 1112.

FIG. 1C illustrates a third mask 113 including a plurality of third openings 113*a*. The third mask 113 is a mask for commonly forming at least one layer among the plurality of layers in a third intermediate layer 1113 (FIG. 2). The third intermediate layer 1113 is an intermediate layer corresponding to sub-pixels for emitting a third color, e.g., red visible rays.

For example, the third mask 113 may be a mask for forming an organic emission layer in the third intermediate layer 1113. The third openings 113*a* may correspond to regions of the layer, e.g., the organic emission layer, that is commonly formed among the third intermediate layer 1113.

FIG. 2 illustrates the organic light emitting display apparatus 100 including the first through third intermediate layers 1111, 1112, and 1113 that are formed by using the first through third masks 111, 112, and 113, respectively. Referring to FIG. 2, the organic light emitting display apparatus 100 may include a plurality of sub-pixels, e.g., a plurality of blue sub-pixels, a plurality of green sub-pixels, and a plurality of red sub-pixels.

For example, the plurality of blue sub-pixels may include first blue sub-pixels 111B, second blue sub-pixels 112B, third blue sub-pixels 113B, and fourth blue sub-pixels 114B. For example, as illustrated in FIG. 2, the first and second blue sub-pixels 111B and 112B may be arranged adjacent to each other in a first direction, e.g., along the X-axis direction, and the third and fourth blue sub-pixels 113B and 114B may be arranged adjacent to each other in the first direction. In addition, a pair of the first and second blue sub-pixels 111B and 112B and a pair of third and fourth blue sub-pixels 113B and 114B may be arranged adjacent to each other in a second direction that is perpendicular to the first direction, e.g., along the Y-axis direction.

In detail, as further illustrated in FIG. 2, the plurality of blue sub-pixels corresponding to one first intermediate layer 1111 may include a first blue sub-pixel 111B, a second blue sub-pixel 112B, a third blue sub-pixel 113B, and a fourth blue sub-pixel 114B. At least one layer in the first intermediate layer 1111 may be commonly formed in the first through fourth blue sub-pixels 111B, 112B, 113B, and 114B. For example, the organic emission layer in the first intermediate layer 1111 may be commonly formed in, e.g., overlap all, the first through fourth blue sub-pixels 111B, 112B, 113B, and 114B. For example, the first through fourth blue sub-pixels 111B, 112B, 113B, and 114B may be arranged in a matrix pattern, and the layer that is commonly formed in the first through fourth blue sub-pixels 111B, 112B, 113B, and 114B may be have a quadrangular shape, e.g., a square shape.

Similarly, the plurality of green sub-pixels may include a first green sub-pixel 111G, a second green sub-pixel 112G, a third green sub-pixel 113G, and a fourth green sub-pixel 114G. The first and second green sub-pixels 111G and 112G may be arranged adjacent to each other in the first direction, and the third and fourth green sub-pixels 113G and 114G may be arranged adjacent to each other in the first direction. In addition, a pair of the first and second green sub-pixels 111G and 112G and a pair of third and fourth green sub-pixels 113G and 114G may be arranged adjacent to each other in the second direction. In addition, at least one layer in the second intermediate layer 1112, e.g., the organic emission layer, may be commonly formed throughout the first through fourth green sub-pixels 111G, 112G, 113G, and 114G.

Similarly, the plurality of red sub-pixels may include a first red sub-pixel 111R, a second red sub-pixel 112R, a third red sub-pixel 113R, and a fourth red sub-pixel 114R. The first and second red sub-pixels 111R and 112R may be arranged adjacent to each other in the first direction, and the third and fourth red sub-pixels 113R and 114R may be arranged adjacent to each other in the first direction. In addition, a pair of the first and second red sub-pixels 111R and 112R and a pair of third and fourth red sub-pixels 113R and 114R may be arranged adjacent to each other in the second direction. In addition, at least one layer in the third intermediate layer 1113, e.g., the organic emission layer, may be commonly formed throughout the first through fourth red sub-pixels 111R, 112R, 113R, and 114R.

Each of the sub-pixels may include a first electrode, a second electrode, and an intermediate layer. A structure of each pixel will be provided in more detail below with reference to FIG. 3.

Referring to FIG. 3, the organic light emitting display apparatus 100 may include a substrate 101, and a buffer layer 102 that is formed on the substrate 101. In addition, at least one thin film transistor (TFT) and an organic light emitting element may be formed on the substrate 101.

In more detail, the substrate 101 may be formed of a transparent glass, e.g., a material including $SiO_2$, a transparent plastic, e.g., an organic material including one or more of polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose tri-acetate (TAC), and cellulose acetate propionate (CAP), etc. The buffer layer 102 may provide an upper surface of the substrate 101 with a flat surface, and may prevent moisture and impurities from penetrating into the substrate 101.

As further illustrated in FIG. 3, an active layer 103 of a predetermined pattern may be formed on the buffer layer 102. The active layer 103 may be formed of an inorganic semiconductor, e.g., amorphous silicon or polysilicon, or an organic semiconductor, and may include a source region, a drain region, and a channel region. A gate insulating layer 104 may be formed on the active layer 103, and a gate electrode 105 may be formed on a predetermined region of the gate insulating layer 104. The gate electrode 105 may be connected to a gate line (not shown) for applying TFT on/off signals. The gate electrode 105 may be formed of metal or an alloy of metals, e.g., one or more of Au, Ag, Cu, Ni, Pt, Pd, Al, Mo, alloy of Al:Nd, or alloy of Mo:W, but embodiments are not limited thereto.

An interlayer dielectric 106 may be formed on the gate insulating layer 104 to cover the gate electrode 105, and the interlayer dielectric 106 may be formed to expose the source and drain regions of the active layer 103. In addition, a source electrode 107 and a drain electrode 108 may be formed to respectively contact the exposed source and drain regions of the active layer 103, thereby completing formation of the TFT.

A passivation layer 109 may be formed on the interlayer dielectric 106 to cover the source electrode 107 and the drain electrode 108. The passivation layer 109 may be formed to expose a predetermined region of the drain electrode 108, and a first electrode 121 may be formed to connect to the exposed region of the drain electrode 108.

A pixel definition layer 125 may be formed on the passivation layer 109 to cover the first electrode 121. The pixel definition layer 125 may include various insulating materials, and may be formed to expose a predetermined region of the first electrode 121. The first intermediate layer 1111 may be formed on the exposed region of the first electrode 121.

Here, at least one layer included in the first intermediate layer 1111 may be commonly formed throughout the first through fourth blue sub-pixels 111B, 112B, 113B, and 114B. For example, the first intermediate layer 1111 may include a plurality of layers, e.g., an organic emission layer 1111a and a functional layer 1111b. At least one of the plurality of layers of the first intermediate layer 1111, e.g., the organic emission layer 1111a, may be formed, e.g., continuously, in the first through fourth blue sub-pixels 111B, 112B, 113B and 114B, and therebetween. In other words, at least the organic emission layer 1111a, e.g., a layer emitting blue visible rays, may be formed continuously to overlap each of the first through fourth blue sub-pixels 111B, 112B, 113B and 114B, and portions of the pixel definition layer 125 therebetween. Here, the layer that is commonly formed in the first intermediate layer 1111 may be formed by using various methods, e.g., the organic emission layer 1111a may be formed by a deposition method.

Although not shown in FIG. 3, the second and third intermediate layers 1112 and 1113 may be commonly formed throughout four adjacent green and red sub-pixels, respectively, as described previously with reference to the blue sub-pixels.

Referring back to FIG. 3, a second electrode 122 may be formed on the first intermediate layer 1111 throughout all of the sub-pixels. Further, a sealing member (not shown) may be disposed on the second electrode 122. The sealing member may be formed to protect the first intermediate layer 1111 and the other layers from external moisture or oxygen, and may be formed of a transparent material, e.g., a glass material, a plastic material, or a plurality of overlapping organic and inorganic materials.

The organic light emitting display apparatus 100 of the present embodiment may include at least one layer of the intermediate layer that is commonly formed throughout four sub-pixels emitting light of the same color and arranged in the first and second directions. Thus, sub-pixels having small sizes may be formed without reducing the size of the openings formed in the mask, i.e., the sub-pixels may be formed to have smaller sizes than the openings in the mask. That is, one of the intermediate layers shared by four sub-pixels may be formed per one opening in the mask. Therefore, small sub-pixels may be easily fabricated, and thus, image quality characteristics of the organic light emitting display apparatus 100 of high resolution may be improved.

In the present embodiment, the organic light emitting display apparatus 100 is an active matrix (AM) type organic light emitting display apparatus adopting the TFT. However, example embodiments are not limited thereto, e.g., the organic light emitting display apparatus 100 may be applied to a passive matrix (PM) type organic light emitting display apparatus.

Figure 4:
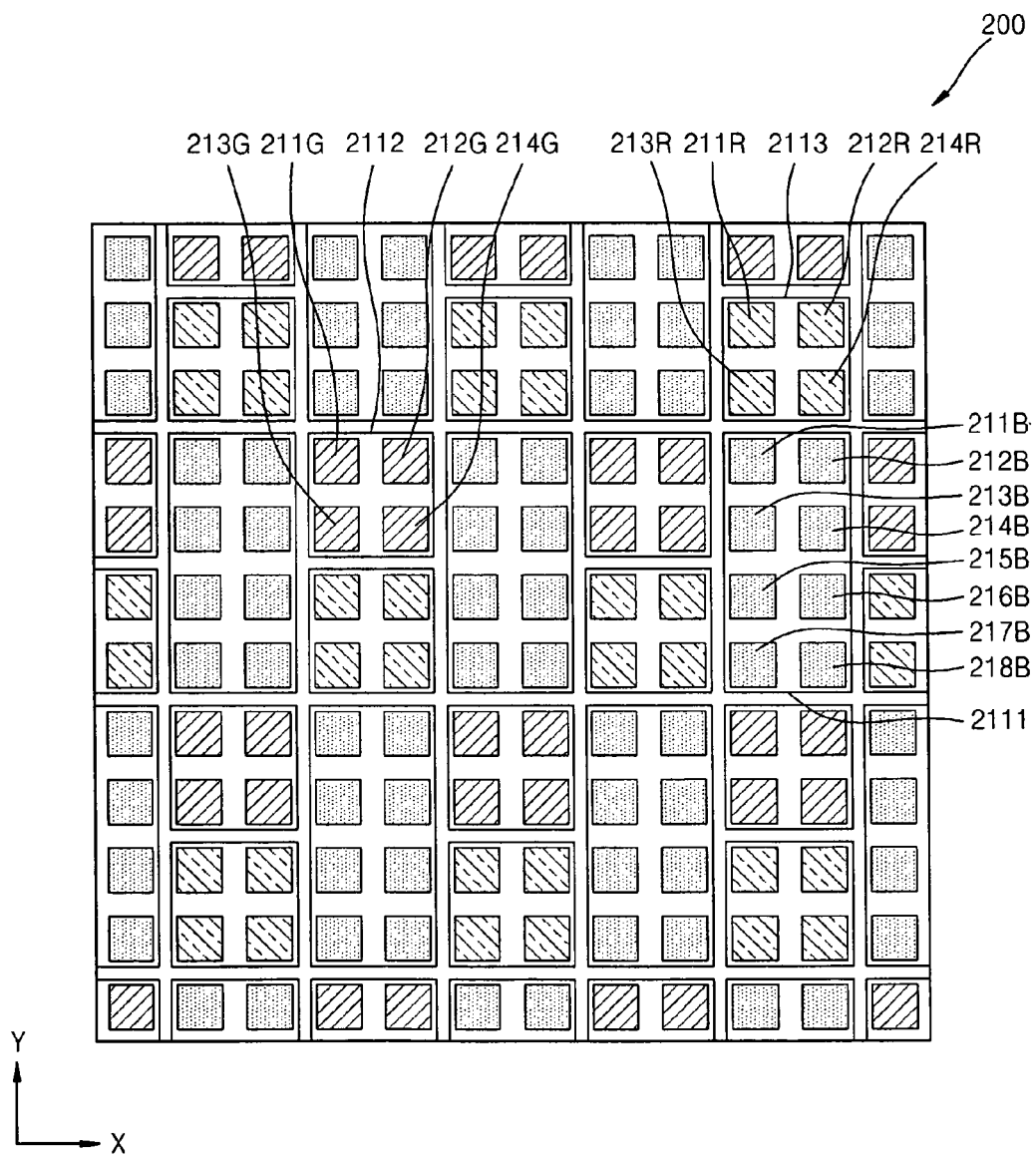
FIG. 4 illustrates a schematic plan view of an organic light emitting display apparatus according to another embodiment.

FIG. 4 illustrates a plan view of an organic light emitting display apparatus 200 according to another embodiment. Referring to FIG. 4, the organic light emitting display apparatus 200 may include a plurality of sub-pixels, e.g., a plurality of blue sub-pixels, a plurality of green sub-pixels, and a plurality of red sub-pixels.

Each of the blue sub-pixels may include a first blue sub-pixel 211B, a second blue sub-pixel 212B, a third blue sub-pixel 213B, a fourth blue sub-pixel 214B, a fifth blue sub-pixel 215B, a sixth blue sub-pixel 216B, a seventh blue sub-pixel 217B, and an eighth blue sub-pixel 218B. The first and second blue sub-pixels 211B and 212B may be arranged adjacent to each other in the first direction. In addition, the third and fourth blue sub-pixels 213B and 214B may be arranged adjacent to each other in the first direction, the fifth and sixth blue sub-pixels 215B and 216B may be arranged adjacent to each other in the first direction, and the seventh and eighth blue sub-pixels 217B and 218B may be arranged adjacent to each other in the first direction.

In addition, the first, third, fifth, and seventh blue sub-pixels 211B, 213B, 215B, and 217B may be arranged adjacent to each other in the second direction. The second, fourth, sixth, and eighth blue sub-pixels 212B, 214B, 216B, and 218B may be arranged adjacent to each other in the second direction.

The first through eighth blue sub-pixels 211B, 212B, 213B, 214B, 215B, 216B, 217B, and 218B may share at least one layer included in a first intermediate layer 2111, e.g., an organic emission layer included in the first intermediate layer 2111. For example, the organic emission layer in the first intermediate layer 2111 may be commonly formed in, e.g., overlap all, the first through eighth blue sub-pixels 211B, 212B, 213B, 214B, 215B, 216B, 217B, and 218B. For example, the first through eighth blue sub-pixels 211B, 212B, 213B, 214B, 215B, 216B, 217B, and 218B may be arranged in a matrix pattern, and the layer that is commonly formed in the first through eighth blue sub-pixels 211B, 212B, 213B, 214B, 215B, 216B, 217B, and 218B may have a quadrangular shape, e.g., a rectangular shape, overlapping, e.g., entirely overlapping, the eight adjacent blue sub-pixels.

Each of the green sub-pixels may include a first green sub-pixel 211G, a second green sub-pixel 212G, a third green sub-pixel 213G, and a fourth green sub-pixel 214G. The first and second green sub-pixels 211G and 212G may be arranged adjacent to each other in the first direction, and the third and fourth green sub-pixels 213G and 214G may be arranged adjacent to each other in the first direction. In addition, a pair of the first and second green sub-pixels 211G and 212G and a pair of the third and fourth green sub-pixels 213G and 214G may be arranged adjacent to each other in the second direction that is perpendicular to the first direction. In addition, the first through fourth green sub-pixels 211G, 212G, 213G, and 214G may share at least one layer included in a second intermediate layer 2112, e.g., the organic emission layer may be formed commonly with respect to the first through fourth green sub-pixels 211G, 212G, 213G, and 214G.

Each of the red sub-pixels may include a first red sub-pixel 211R, a second red sub-pixel 212R, a third red sub-pixel 213R, and a fourth red sub-pixel 214R. The first and second red sub-pixels 211R and 212R may be arranged adjacent to each other in the first direction, and the third and fourth red sub-pixels 213R and 214R may be arranged adjacent to each other in the first direction. In addition, a pair of the first and second red sub-pixels 211R and 212R and a pair of third and fourth red sub-pixels 213R and 214R may be arranged adjacent to each other in the second direction. In addition, at least one layer in the third intermediate layer 2113 may be commonly formed throughout the first through fourth red sub-pixels 211R, 212R, 213R, and 214R, e.g., the organic emission layer in the third intermediate layer 2113 may be commonly formed.

In the organic light emitting display apparatus 200 of the present embodiment, one layer of the plurality of layers in the intermediate layer may be commonly formed throughout two blue sub-pixels arranged in the first direction and four blue sub-pixels arranged in the second direction, i.e., in eight blue sub-pixels. In addition, one layer in the intermediate layer may be commonly formed with respect to four adjacent green sub-pixels or four adjacent red sub-pixels arranged in the first and second directions. However, example embodiments are not limited thereto, and one layer in the intermediate layer may be commonly formed with respect to eight red sub-pixels or eight green sub-pixels.

Therefore, sub-pixels having smaller sizes than that of an opening in a mask may be formed without reducing the size of the opening formed in the mask when forming an intermediate layer. That is, one of the intermediate layers may be commonly formed with respect to four or eight sub-pixels, i.e., the one of the intermediate layers may correspond to a single opening of the mask. Therefore, sub-pixels of smaller sizes may be easily fabricated. In addition, the image quality characteristics of the organic light emitting display apparatus 200 of high resolution may be improved. As such, an organic light emitting display apparatus may have improved image quality characteristics via a simplified manufacturing process.

In contrast, when sizes of sub-pixels and gaps therebetween are reduced in a conventional organic light emitting display apparatus to realize high resolution with high quality images, there may be a physical limit to a reduced size of mask openings. That is, when each mask opening corresponds to one sub-pixel, precise patterns of sub-pixels and alignment of the mask openings with a substrate may be difficult and/or physically limited. Accordingly, it may be difficult to improve image quality characteristics of the conventional organic light emitting display apparatus.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display apparatus comprising a plurality of primary sub-pixels, each of the primary sub-pixels including:
    a plurality of secondary sub-pixels of a same color;
    a first electrode corresponding to each secondary sub-pixel;
    a second electrode facing the first electrodes; and
    an intermediate layer disposed between the first and second electrodes, the intermediate layer having a plurality of layers including an organic emission layer, at least one layer of the plurality of layers in the intermediate layer being commonly shared by two secondary sub-pixels arranged in a first direction and by at least two secondary sub-pixels arranged in a second direction perpendicular to the first direction, wherein each primary sub-pixel is aligned with an adjacent primary sub-pixel along each of the first and second directions.

2. The organic light emitting display apparatus as claimed in claim 1, wherein the at least one commonly shared layer of the intermediate layer is continuous in four secondary sub-pixels arranged in the second direction, the four sub-pixels in the second direction emitting light of a same color.

3. The organic light emitting display apparatus as claimed in claim 1, wherein the at least one commonly shared layer of the intermediate layer is the organic emission layer.

4. The organic light emitting display apparatus as claimed in claim 1, wherein the at least one commonly shared layer of the intermediate layer has a square shape.

5. The organic light emitting display apparatus as claimed in claim 1, wherein the at least one commonly shared layer of the intermediate layer corresponds to secondary sub-pixels emitting light of the same color.

6. The organic light emitting display apparatus as claimed in claim 1, wherein the at least one commonly shared layer of the intermediate layer overlaps at least four secondary sub-pixels, the at least four secondary sub-pixels being adjacent to each other and arranged in a matrix pattern.

7. The organic light emitting display apparatus as claimed in claim 1, wherein the at least one commonly shared layer of the intermediate layer is a continuous layer overlapping at least four secondary sub-pixels and regions therebetween.

8. The organic light emitting display apparatus as claimed in claim 1, wherein each primary sub-pixel overlaps a single adjacent primary sub-pixel along each of the first and second directions.

9. The organic light emitting display apparatus as claimed in claim 1, wherein all the secondary sub-pixels within each of the primary sub-pixels emit a same light color.

10. The organic light emitting display apparatus as claimed in claim 9, wherein first through third adjacent primary sub-pixels emit three different light colors, a first primary sub-pixel including more secondary sub-pixels than each of the second and third primary sub-pixels.

11. A method of forming an organic light emitting display apparatus with a plurality of primary sub-pixels, the method comprising:
    defining a plurality of secondary sub-pixels of a same color;
    forming a first electrode in each secondary sub-pixel;
    forming a second electrode facing the first electrode; and
    forming an intermediate layer between the first and second electrodes, the intermediate layer having a plurality of layers including an organic emission layer, at least one layer of the plurality of layers in the intermediate layer being commonly formed in two secondary sub-pixels arranged in a first direction and in at least two secondary sub-pixels arranged in a second direction perpendicular to the first direction, wherein each primary sub-pixel is aligned with an adjacent primary sub-pixel along each of the first and second directions.

12. The method as claimed in claim 11, wherein forming the at least one layer of the plurality of layers in the intermediate layer includes using a mask having opening, the openings in the mask being larger than a size of a single secondary sub-pixel in the organic light emitting display apparatus.

13. The method as claimed in claim 12, wherein each opening in the mask overlaps at least four secondary sub-pixels emitting a same color of light.

* * * * *